(12) United States Patent
Polesel

(10) Patent No.: US 8,627,511 B2
(45) Date of Patent: Jan. 7, 2014

(54) ELECTRONIC CONTROL AND AMPLIFICATION DEVICE FOR A LOCAL PIEZOELECTRIC FORCE MEASUREMENT PROBE UNDER A PARTICLE BEAM

(75) Inventor: Jerome Polesel, Gif sur Yvette (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/575,809

(22) PCT Filed: Jan. 27, 2011

(86) PCT No.: PCT/EP2011/051096
§ 371 (c)(1),
(2), (4) Date: Jul. 27, 2012

(87) PCT Pub. No.: WO2011/092225
PCT Pub. Date: Aug. 4, 2011

(65) Prior Publication Data
US 2012/0304341 A1    Nov. 29, 2012

(30) Foreign Application Priority Data
Jan. 29, 2010   (FR) .................................... 10 50633

(51) Int. Cl.
*G01Q 20/00* (2010.01)
(52) U.S. Cl.
USPC ................................................. 850/5; 850/4
(58) Field of Classification Search
USPC ............................................... 850/5, 4
See application file for complete search history.

(56) References Cited

U.S. PATENT DOCUMENTS

| | | | |
|---|---|---|---|
| 3,750,010 A * | 7/1973 | Abnett et al. | 324/243 |
| 4,602,308 A * | 7/1986 | Montague | 361/91.5 |
| 5,127,077 A * | 6/1992 | Iyer et al. | 385/116 |
| 5,383,354 A * | 1/1995 | Doris et al. | 73/105 |
| 5,892,223 A * | 4/1999 | Karpov et al. | 850/59 |
| 2005/0269510 A1* | 12/2005 | Chang | 250/309 |
| 2006/0057566 A1* | 3/2006 | Van Ness et al. | 435/6 |
| 2006/0076489 A1* | 4/2006 | Ohshima et al. | 250/310 |

(Continued)

FOREIGN PATENT DOCUMENTS

WO   WO 2009/085772 A2   7/2009
WO   WO 2009/085772 A3   7/2009

OTHER PUBLICATIONS

Atsushi Kikukawa et al., "Magnetic Force Microscope Combined with a Scanning Electron Microscope", 8257a Journal of Vacuum Science & Technology A, vol. 11, No. 6, XP-000412888, Nov. 1, 1993, pp. 3092-3098.

(Continued)

*Primary Examiner* — Robert Kim
*Assistant Examiner* — Kevin Chung
(74) *Attorney, Agent, or Firm* — Oblon, Spivak, McClelland, Maier & Neustadt, L.L.P.

(57) ABSTRACT

An electronic control device for a local probe with a piezoelectric resonator and preamplification and processing of its signals, the probe being configured for local measurement of physical properties of a sample in an environment with a particle beam directed towards the probe, in which an excitation voltage generated by an excitation mechanism is applied to the piezoelectric resonator through a first galvanic isolation transformer, and a current for measurement of mechanical oscillations of the piezoelectric resonator is applied through a second galvanic isolation transformer to a preamplification device on the output side.

13 Claims, 6 Drawing Sheets

(56) References Cited

U.S. PATENT DOCUMENTS

| | | | |
|---|---|---|---|
| 2008/0149832 A1* | 6/2008 | Zorn | 250/311 |
| 2009/0242764 A1* | 10/2009 | Xi et al. | 250/310 |
| 2010/0320171 A1 | 12/2010 | Mao et al. | |

OTHER PUBLICATIONS

C. L. Jahncke et al., "Choosing a preamplifier for Tuning Fork Signal Detection in Scanning Force Microscopy", Review of Scientific Instruments, vol. 75, No. 8, XP-012072007, Aug. 18, 2004, pp. 2759-2761.

R. H. M. Smit et al., "A Low Temperature Scanning Tunneling Microscope for Electronic and Force Spectroscopy", Review of Scientific Instruments, vol. 78, No. 11, XP-012103717, Nov. 9, 2007, pp. 113705-1-113705-5.

Robert D. Grober et al., "Fundamental Limits to Force Detection Using Quartz Tuning Forks", Review of Scientific Instruments, vol. 71, No. 7, XP-012038401, Jul. 1, 2000, pp. 2776-2780.

M. Heyde et al., "Double Quartz Tuning Fork Sensor for Low Temperature Atomic Force and Scanning Tunneling Microscopy", Review of Scientific Instruments, vol. 75, No. 7, XP-012071689, Jul. 1, 2004, pp. 2446-2450.

Franz J. Giessibl, "Advances in Atomic Force Microscopy", Reviews of Modern Physics, vol. 75, Jul. 2003, pp. 949-983.

"Transparently Combining SEM, TEM & FIBs with AFM/SPM & NSOM", A Nanonics Imaging Solution, Issue 2.3, Dec. 2002, 4 pages.

Yongho Seo et al., "Electrostatic Force Microscopy Using a Quartz Tuning Fork", Applied Physics Letters, vol. 80, No. 23, Jun. 10, 2002, pp. 4324-4326.

Dave LeVasseur, "Midcom Transformer Theory", Technical Note 69, Jun. 1, 1998, pp. 1-70.

"Pulse Transformers", Rhombus Industries Inc., p. 8.

"Application Notes", Appendix 6, BH Electronics, pp. 24-26.

J. C. Gonzalez et al., "Scanning Probe Microscopy and Scanning Electron Microscopy for Electrical Characterization of Semiconductors", FORMATEX 2004, pp. 274-282.

"A Guide to Scanning Microscope Observation", JEOL Serving Advanced Technology, pp. 1-35.

B. Kaczer et al., "Gate Oxide Breakdown in FET Devices and Circuits: From Nanoscale Physics to System-level Reliability", Microelectronics Reliability 47, 2007, pp. 559-566.

Salvatore Lombardo, "Dielectric Breakdown Mechanisms in Gate Oxides", Journal of Applied Physics 98, 2005, pp. 121301-1-121301-36.

* cited by examiner

ELECTRONIC CONTROL AND AMPLIFICATION DEVICE FOR A LOCAL PIEZOELECTRIC FORCE MEASUREMENT PROBE UNDER A PARTICLE BEAM

TECHNICAL FIELD

This invention relates to an electronic control and amplification device for a local piezoelectric force measurement probe under a particle beam.

STATE OF PRIOR ART

The field of this invention is control and amplification electronics for local piezoelectric force probes, for combined use under illumination of an electron beam in scanning electron microscopes (SEM) or transmission electron microscopes (TEM) or in a focussed ion beam (FIB) probe, or in any environment in which there is a high energy charged particle beam present. The omnipresence of tools like SEM, TEM and FIB for industry and fundamental research, that is applied in micro-fabrication or microelectronics, illustrates the benefits of a device for in situ measurement of forces or mechanical and electronic characteristics occurring in micro-electromechanical systems (MEMS) and nano-electromechanical systems (NEMS) used at the sub-micrometric scale, while displaying the system by far field microscopy in parallel.

For more than twenty years, local Atomic Force Measurement (AFM) type probes have had a unique potential to characterise forces over a range varying from a microNewton to a picoNewton over sections of a few nanometers through the apex of a microtip as described in document reference [1] at the end of the description. Standard AFM force measurement systems typically use laser optical detection to detect deflection of a microlever probing the surface of a sample through the apex of the microtip fixed to the end of said microlever. This detection technique known to those skilled in the art has the disadvantage that it is difficult to integrate into a constrained operating environment such as the vacuum chamber of a scanning electron microscope SEM or an FIB probe. Therefore, the local probe is constrained on several degrees of freedom in space. Document reference [2] discloses a system integrating a local force measurement probe in a SEM or TEM electron microscope or an FIB probe. Document reference [3] discloses integration of a local probe into such a far field microscope.

Local probes with built-in sensors can solve integration and movement problems. As described in document reference [1], local piezoelectric probes thus enable a sensitive detection in force overcoming a laser deflection detection system. A local piezoelectric resonant probe may be in the form of a monolithic quartz or a tuning fork supporting a microtip that probes the surface of the sample. This piezoelectric resonator is kept in oscillation. The interaction between the microtip and the surface of the sample causes a change in the resonant properties of this piezoelectric resonator; oscillation amplitude, drift in the resonant frequency, change in the excitation energy. Measurement of this change in resonance properties, for example the frequency drift, enables knowledge of the forces involved on the scanned sample, due to prior calibration. But this requires a precise measurement of the electrical displacement current (less than one nano-Ampere) generated by the probe. In an environment under a beam of electrically charged particles (electrons in SEM or TEM electron microscope, ions in a focussed ion beam (FIB) probe)), the emission current created in the sample by the beam prevents any combined use with the local piezoelectric probe. Preamplifiers according to known art for example as disclosed in document reference [4], cannot overcome this problem of a precise measurement of the probe displacement electrical current when the probe is illuminated by the beam of electrically charged particles. Furthermore, under the illumination of the beam of electrically charged particles, electrostatic discharge problems can damage preamplifiers used to measure the probe displacement current, under high energy.

The purpose of the invention is to solve this technical problem by offering an electronic device for control and amplification of a local force measurement piezoelectric probe for integration and operation of this probe under a beam of charged or uncharged particles in an environment found particularly frequently in SEM or TEM type electron microscopes and focussed ion beam (FIB) probes, as conventionally used in microelectronics and micro-manufacturing to characterise and machine chips and micro-electromechanical and nano-electromechanical (MEMS, NEMS) systems.

PRESENTATION OF THE INVENTION

The invention relates to an electronic control device for a local probe with piezoelectric resonator and preamplification and processing of its signals, this probe being designed for local measurement of the physical properties of a sample in an environment with a particle beam directed towards the probe, characterised in that:

- an excitation voltage generated by excitation means is applied to the piezoelectric resonator through a first galvanic isolation transformer, and in that a current for measurement of mechanical oscillations of the piezoelectric resonator is applied through a second galvanic isolation transformer to preamplification means on the output side,
- the first and second transformers have a sufficiently high primary/secondary breakdown voltage to resist the overvoltage generated by the particle beam,
- the impedances of the transformer windings are sufficiently low so that the electrical current generated in the conducting elements by the electrical pulse induced by the particle beam is incapable of damaging the first stage of the preamplification means placed on the output side.

Preferably, all windings in these transformers have one pole connected to the ground or to a virtual ground, in other words one input of an operational amplifier, the other input of which is connected to the ground.

The particle beam may be a beam of electrically charged particles, for example an electron or ion beam or a beam composed of electrically neutral particles such as atoms or neutrons.

When the particle beam induces an electrical pulse, this parasite source behaves like a current source with an extremely high impedance (of the order of 10 or 100 MOhms or even more). The primary/secondary breakdown voltage of transformers according to the invention is chosen to be greater than the voltage induced by the product of this current and the impedance of the transformer winding.

However, this induced voltage will drop as soon as the electrical pulse is received by an electrical conducting element because according to the invention, it is galvanically connected to a winding with a very low DC impedance (a few Ohms and preferably a fraction of an Ohm). The resulting voltage at the terminals of this conducting element is divided by the ratio between the impedances (for example $100 \times 10^6/0.5$), in other words a practically zero voltage. Obviously according to the invention, this voltage must be less than the breakdown voltage at the preamplifier input. However, this obvious condition is not always stated in the claim because it is always achieved with the impedance mismatch described above; this voltage induced at the terminals of the very low impedance winding of the transformer is typically of the order of one μV. Due to this mismatch, the pulse induced by the charged particle beam on the electrode of the local piezoelectric resonator probe connected to the transformer winding is not more than an induced voltage (of the order of one μV) which is much less than the breakdown voltage at the preamplifier input.

The very low parasite current, when the particle beam induces an electrical pulse, is applied to the terminals of the piezoelectric resonator contained in the probe, the input impedance of which is of the order of 100 MΩ away from resonance, and 10 kΩ at resonance. However, since resonance is very sharp, it can be assumed that most of the energy due to the particle beam covers the piezoelectric resonator away from its natural frequency, in other words at 100 MΩ. The low impedance of the transformer winding connected to it, of the order of a few ohms and preferably less than one ohm, means that it can only apply an extremely low voltage.

According to the invention, the voltage induced by this extremely low current (typically of the order of one μA and preferably less) must be sized by the choice of components so that it does not induce any damage on the input stage of the preamplification means. Normally, these preamplification means are fitted with FET transistors and their electrical breakdown characteristics are known.

Galvanic isolation transformers are chosen to be adapted to the frequency band of the piezoelectric resonator. Parameters to be considered for the piezoelectric resonator are its resonant frequency f0 and its quality factor Q=f0/Df, where Df is the band width at −3 dB from its resonance curve in amplitude. For each winding, the primary inductance, the DC resistance, the inter-winding capacitance (between the primary and the secondary), the leakage inductance and the E.T. constant are controlling parameters for matching the frequency response of transformers around the resonant frequency f0 of the piezoelectric resonator. The inductance $L_{prim}$ of the primary winding of the transformer is the main parameter determining the low cutoff frequency $f_1$ of the transformer, the DC resistance of the winding participating to a lesser extent. $f_1$ is defined by:

$$f_1 = X_{1min}/(2*pi*L_{prim})$$

where $L_{prim}$ is the inductance of the primary and $X_{1min}$ is the minimum reactance to achieve an attenuation G (in dB) of the signal amplitude at frequency $f_1$. This reactance depends on the resistance of the input source, such that:

$$X_{1min} = Rg/(2*\sqrt{(A^2-1)})$$

where Rg is the resistance of the voltage source, and $A=10^{(G/20)}$

The high cutoff frequency $f_h$ of the transformer is determined by the leakage inductance $L_{leak}$, and the inter-winding capacitance $C_i$ such that:

$$fh = 1/(2*pi*\sqrt{(L_{leak}*C_i)})$$

Saturation of the magnetic core of the transformer may induce a distortion of the signal output from the secondary. The E.T. constant denoted $K_{ET}$ gives the limitation of the signal frequency that can pass through the transformer without any distortion effect for a given amplitude in volts of the signal input into the primary, such that:

$$K_{ET} = U*T$$

where U is the amplitude of the input signal in volts and T is the period of the signal in microseconds. The theoretical parameter settings or the experimental measurement of dynamic parameters of the transformer are well known to those skilled in the art. Concerning calculation methods to configure the frequency passband of the transformer, it would for example be possible to use the document reference [6]. Document reference [7] discloses an accepted equivalent model known to those skilled in the art, to digitally simulate the transformer at low and high frequency, for example on a SPICE digital simulation engine. Methods of experimental characterisation of dynamic parameters of the transformer are given in reference document [8].

Advantageously, the first transformer is a symmetric point transformer, for which the ratio of the number of winding turns is 1:1+1.

Advantageously, the second transformer has a ratio of the number of winding turns 1:1, with the same electrical characteristics as the first transformer. In this respect, the modulus of the output voltage applied to the secondary(ies) of the transformers will be equal to the modulus of the input voltage applied to the primary of the transformers. These characteristics of the two transformers enable a pass band type unit gain response within a frequency range around resonance f0 of the piezoelectric resonator and greater than the band width Df at −3 dB from the resonance curve in amplitude of the piezoelectric resonator.

Galvanic isolation transformers can resist an electric shock caused by a particle beam directed onto the probe. The emission current produced by the particle beam directed towards the probe and the sample is used to define the minimum breakdown voltage and the maximum pulse current from these two transformers.

Advantageously, the galvanic isolation transformer windings have a low input impedance at the emission current generated in the probe by the charged particle beam. The voltage thus generated at the terminals of the primary winding is equal to the product of the impedance of the winding and the emission current due to the presence of the beam on the piezoelectric probe. With a DC resistance of the order of one ohm and preferably less, the voltage induced by the particle beam is equal to not more than one microVolt. Furthermore, the low frequency almost DC component of the voltage on the transformer primary caused by the presence of the charged particle beam, is eliminated at the terminals of the secondary winding by the transformer galvanic isolation. Thus, all risks of breakdown on the high impedance input to the output operational amplifier is avoided.

Concerning the possible electrical breakdown in galvanic isolation transformers, this breakdown only occurs when there is a difference in the threshold potential between the two windings (primary and secondary of each transformer) separated by electrical insulation. This potential difference must be less than the breakdown voltage given in the manufacturer's technical data sheet for said transformer. Advantageously, this problem is avoided in this invention by connecting the primary and secondary windings of the two galvanic isolation transformers to the same electrical ground potential.

Advantageously, the probe is fitted with a conducting microtip capable of measuring forces, the end of this microtip being provided with an inorganic or organic coating controlled to increase the selectivity of the measured forces.

Advantageously, the sample is polarised relative to the probe, the sample being electrically connected to a current/voltage converter in order to measure physical properties between the tip and the sample such as the conductance and the tunnel current.

Advantageously, the device according to the invention comprises means of detecting the electrostatic force between the sample and the probe by EFM ("Electrostatic Force Microscopy") measurement or by KPFM (Kelvin probe force microscopy) measurement, known to those skilled in the art.

Advantageously, the probe is fitted with a microtip with a microsphere made of a magnetised remanent magnetic material at its apex, capable of local measurement of magnetic forces on the sample by MFM (i.e. "Magnetic Force Microscopy") known to those skilled in the art.

Advantageously, the apex of the probe is fitted with a thermocouple or a polymer wire to make local thermography of the sample at a constant force gradient or at a constant tip-surface distance.

The device according to the invention comprises the following, in a first example of an advantageous embodiment:

- a very low voltage excitation stage comprising a first operational amplifier for which the non-inverting (+) input is connected to the ground, and in which the inverting (−) input is connected to a generator through a first resistance and to one end of a second resistance, and the output of which is connected to the other end of the second resistance,
- a first galvanic isolation comprising a first symmetric point transformer connected to the output from the first operational amplifier through a third resistance of an impedance matching stage, the capacitor of which is connected to the ground, the first end of the secondary of this first transformer being connected to the ground through a variable capacitor, the second end of the secondary of this first transformer being connected to a first electrode of a piezoelectric resonator, the second electrode of which is connected to the microtip and to the ground,
- a second galvanic isolation comprising a second transformer, of which one end of the primary is connected to the mid-point of the secondary of the first transformer, the other end being connected to the ground, and of which one end of the secondary is connected to the ground through a fourth resistance,
- a first preamplification stage comprising a second operational amplifier, of which the non-inverting (+) input is connected to the ground and of which the inverting (−) input is connected to the second end of the secondary of the second transformer through a capacitor and to one end of a fifth resistance, the other end of which is connected to the output from this second operational amplifier,
- a second amplification stage comprising a first differential instrumentation amplifier connected to the output from the second operational amplifier through a sixth resistance.

In a second example embodiment, it also comprises:

- a first preamplification stage comprising a third operational amplifier and a current-voltage conversion resistance connected between its inverting (−) input and its output, the inverting (−) input of this third operational amplifier also being connected to the sample, and the non-inverting (+) input of this third operational amplifier being connected to a voltage source to polarise the sample relative to the ground,
- a second amplification stage comprising a second differential instrumentation amplifier.

The device according to the invention is very easy to integrate and to use on an SEM or TEM electron microscope, or on an FIB probe. The device according to the invention can eliminate local mechanical measurement artefacts related to illumination of the probe by the charged particle beam.

Target applications of the invention relate to precise and in situ characterisation of microelectromechanical systems MEMS and nanoelectromechnical systems NEMS on wafers, or mounted on packages, but also microelectronics with combined force-electrical current characterisation. The device according to the invention is for example useful in characterisation of accelerometers that are increasingly small and sensitive. In the same way, in situ machining of microstructures using an FIB probe may also be envisaged with the possibility of a real time force feedback due to this invention, capable of adjusting and correcting the position of the focussed ion beam.

Replacing the microtip at the end of the piezoelectric probe by a magnetic micro-probe or a thermocouple also makes it possible to envisage a measurement on magnetic memories or a thermal mapping of a microprocessor during operation respectively, with force feedback to adjust the distance between the micro-probe and the sample surface with a precision of less than one nanometer. Note that such precision cannot be achieved with the resolution of an SEM electron microscope, although such a microscope does enable fairly precise positioning of the probe.

DETAILED PRESENTATION OF PARTICULAR EMBODIMENTS

Figure 1:
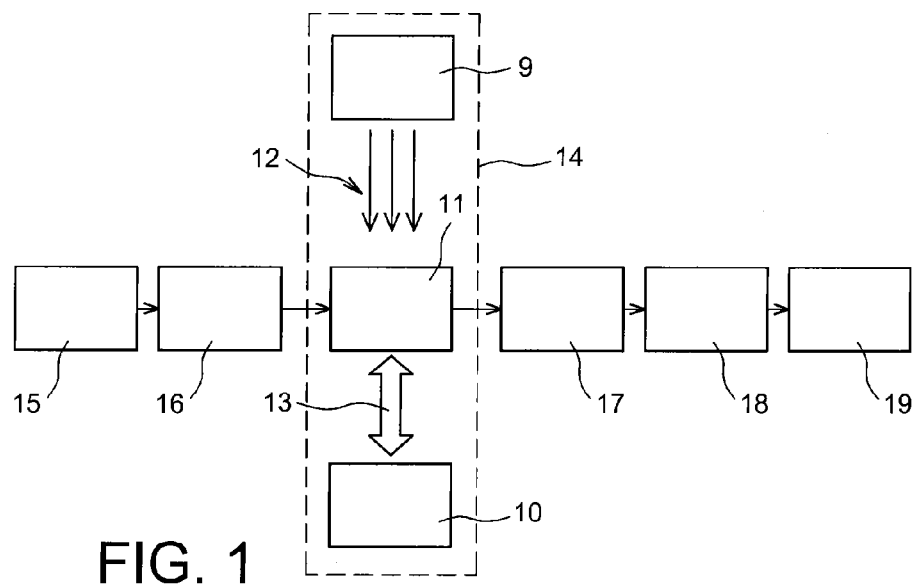
FIG. 1 shows a first embodiment of the device according to the invention.

FIG. 1 shows a first embodiment of the device according to the invention for local measurement of mechanical properties (force, stress, pressure) on a sample 10 with a piezoelectric probe 11 fitted with a microtip (tip) in an environment 14 with a beam of electrically charged particles 12 (SEM or TEM electron microscope or local FIB ion probe) oriented towards the piezoelectric probe 11 and the sample 10, with an interaction between the microtip 22 (shown on the diagrams in FIGS. 3 and 4) and the sample 10 shown by a double arrow 13.

This first embodiment comprises the following modules:
- a very low voltage excitation stage 15,
- a first galvanic isolation 16,
- a second galvanic isolation 17,
- a first preamplification stage 18 (current-voltage amplifier called transimpedance amplifier), for local mechanical characterisation,
- a second mechanical characterisation amplification stage 19, therefore modules 11, 15, 16, 17, 18 and 19 enabling a local mechanical characterisation.

This first embodiment can give a total isolation between the local probe high frequency displacement current to simultaneously measure its mechanical oscillation movement, and the emission current generated by the electrically charged particle beam with continuous flow. It then becomes possible to make a characterisation by SEM, TEM or FIB imagery, while simultaneously measuring local forces at a scale of a few picoNewtons. The lack of external detection, as in the case of AFM laser detection, means that the local piezoelectric probe can enjoy degrees of freedom of movement in the three dimensions. Far field imagery (SEM, TEM or FIB) helps in judicious placement of the local probe for measurement of mechanical properties of the sample. Thus, it then becomes possible to machine a three-dimensional microstructure using an FIB probe, while measuring local forces, pressures or stresses on the sample at the same time. The force feedback can help optimum repositioning of the FIB probe ion beam.

Figure 2:
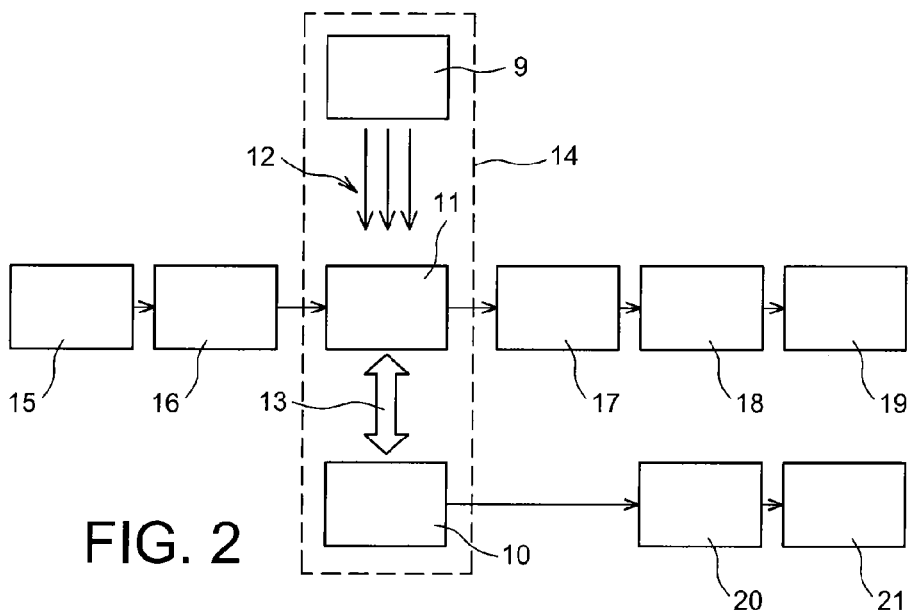
FIG. 2 shows a second embodiment of the device according to the invention.

A second embodiment shown in FIG. 2 can be used to make a local measurement of electronic properties (conductance, tunnel current) on a sample 10, in addition to the local measurement of mechanical properties (force, stress, pressure) on the same sample by means of the piezoelectric probe 12 in an environment 14 in which there is an electrically charged particle beam.

This second embodiment comprises the following in addition to the modules 10-12 and 15-19 already shown in FIG. 1:
- a first local electrical characterisation preamplification stage 20 (current-voltage amplifier called transimpedance amplifier),
- a second local electrical characterisation amplification stage 21, therefore modules 10, 11, 15, 16, 20 and 21 enabling a local electrical characterisation.

This second embodiment can make simultaneous local force and electronic current measurements between the microtip 22 and the sample 10. The sample is thus polarised by an external voltage and connected to the current-voltage preamplification (transimpedance) stage 20, the electrically charged particle beam being switched off to not disturb this preamplification stage 20 connected to the sample. Force regulation of the piezoelectric probe 11 can maintain a constant distance from the sample 10 during the electrical measurement. The local electrical conductance-stress σ(∈) characterisation then becomes possible in the environment of an SEM electron microscope on piezoresistive samples, that are widely used in microelectromechanical systems MEMS and nanoelectromechanical systems NEMS. The electrical map for a chip in operation can also be envisaged with this second embodiment.

Figure 3:
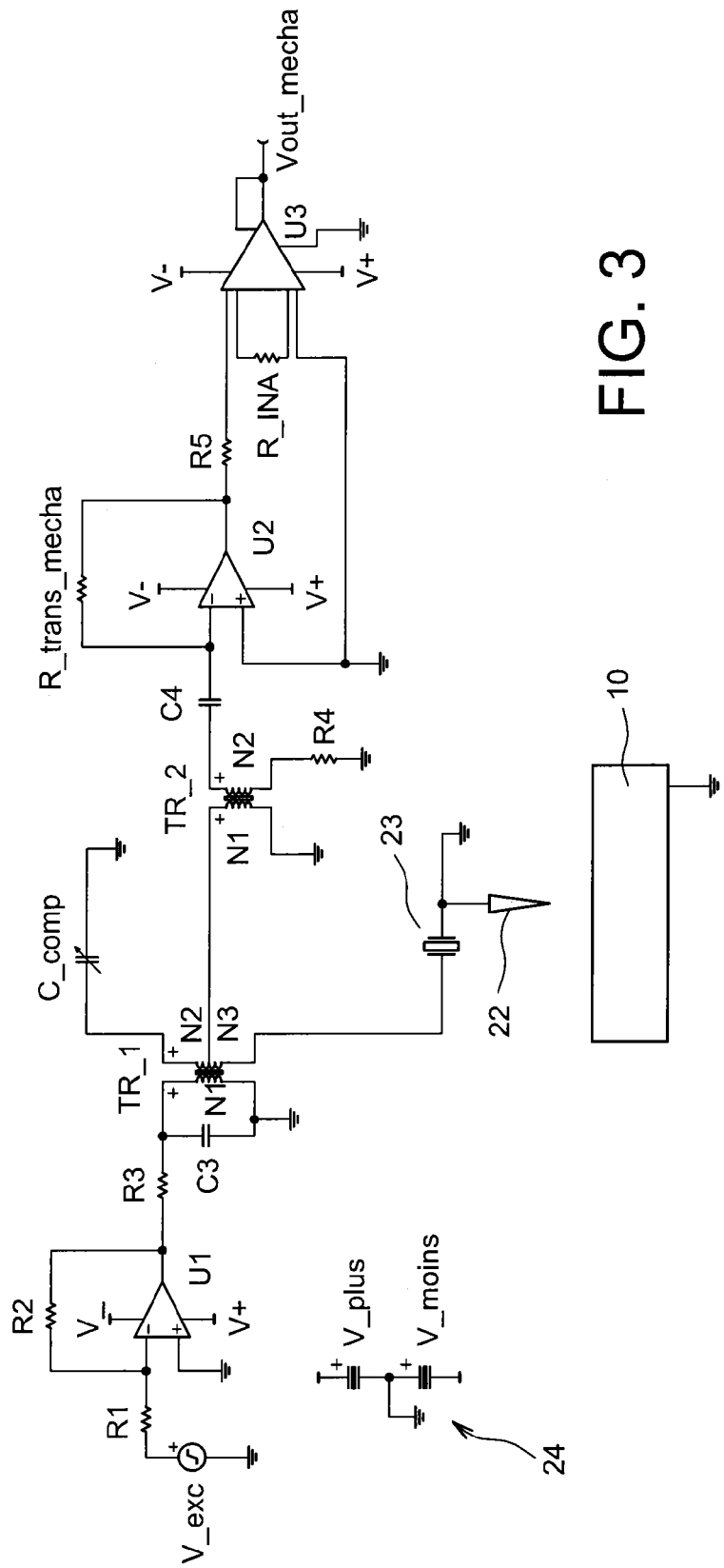
FIG. 3 shows an example of the first embodiment of the device according to the invention shown in FIG. 1.

EXAMPLE EMBODIMENTS a) Electronic Device for Local Measurement of Mechanical Properties of a Sample This first example embodiment shown in FIG. 3 corresponds to application of the first embodiment shown in FIG. 1.

This device comprises:
a very low voltage excitation stage comprising a first operational amplifier U1 for which the non-inverting (+) input is connected to the ground, the inverting (−) input is connected to a Vexc generator through a first resistance R1 and to one end of a second resistance R2, and the output of which is connected to the other end of the second resistance R2,
a first galvanic isolation comprising a first symmetric point transformer TR_1 connected to the output from the first operational amplifier U1 through a third resistance R3 of an impedance matching stage R3, C3, of which the capacitor C3 is connected to the ground, the first end of the secondary of this transformer being connected to the ground through a variable capacitor C_comp, the second end of the secondary of this transformer being connected to a first electrode of a piezoelectric resonator 23, the second electrode of which is connected to the microtip 22 and to the ground,
a second galvanic isolation comprising a second transformer TR_2 of which one end of the primary is connected to the mid-point of the secondary of the first transformer TR_1, the other end being connected to the ground, and of which a first end of the secondary is connected to the ground through a fourth resistance R4,
a first preamplification stage comprising a second operational transimpedance amplifier U2, of which the non-inverting (+) input is connected to the ground and of which the inverting (−) input is connected to the second end of the secondary of the second transformer TR_2 through a capacitor C4 and to one end of a fifth resistance R_trans_mecha the other end of which is connected to the output from this second operational amplifier U2,
a second amplification stage comprising a first differential instrumentation amplifier U3 with a gain resistance R_INA, connected to the output from the second operational amplifier U2 through a sixth resistance R6.

The primary and secondary windings of the two transformers TR_1 and TR_2 are connected to the same ground potential (which includes the virtual mass of an operational amplifier input, of which the other input is the ground).

The excitation stage comprising the first operational amplifier U1 and resistances R2 and R1 is a voltage divider that excites the resonant piezoelectric probe 23 with very small oscillation amplitudes at the resonant frequency varying from a few tens of kiloHertz to several tens of megaHertz. Oscillation amplitudes of the order of one Angström guarantee very good force detection sensitivity without significantly disturbing the probed sample. The impedance matching stage R3-C3 enables optimised impedance matching on the first isolation transformer TR_1. This transformer TR_1 enables firstly transmission of the electrical excitation onto the piezoelectric resonator 23, but also eliminates parasite capacitance effects known to those skilled in the art, related to the inter-electrode capacitance of the piezoelectric resonator but also to the length of the probe connection wires, due to the adjustment of the variable capacitor C_comp. The mechanical response of the piezoelectric resonator 23 interacting with the sample 10 causes a modification to the electric displacement current transmitted by the same wire on the second isolating transformer TR_2. Therefore the secondary of this transformer TR_2 transmits this displacement current onto the second operational amplifier U2 with the current-voltage conversion resistance R_trans_mecha. The network R4-C4 enables optimised impedance matching with the second transformer TR_2. The first differential instrumentation amplifier U3 outputs a voltage that can be used by a measurement system on the output side to extract modifications to resonance properties of the piezoelectric resonator 23 in interaction with the sample 10, and therefore obtain local mechanical measurements. The presence of the two isolating transformers TR_1 and TR_2 acts like an electrical barrier that avoids contamination of the useful signal by the presence of the electrically charged particle beam on the probe, in the SEM, TEM or FIB chamber. Grounding of the microtip 22 through an electrode of the piezoelectric resonator 23 and the sample 10 enables evacuation of electrical charges due to the electrically charged particle beam and therefore avoids the appearance of disturbing electrostatic forces between the microtip 22 and the sample 10.

The transformer TR_2 has the advantage that it has a low input impedance at the signal from the piezoelectric probe 11 exposed to the charged particle beam. The voltage thus generated at the terminals of the primary winding of the transformer TR_2 is equal to the product of the impedance of the winding and the emission current due to the presence of the beam on the piezoelectric probe. The result is thus a maximum voltage of one microVolt, the DC resistance of the winding being of the order of one ohm. During operations in Scanning Electron Microscopy (SEM), a fraction of the secondary electrons that do not escape from the sample flows through the electrical ground. These secondary electrons are caused by the high energy electron beam. This current may be measured by placing an ammeter between the sample and the ground. This so-called "absorbed" current or "probe" or emission current varies from the order of one picoAmpere to a maximum of one microAmpere. Further details about this emission current can be found for example in documents reference [9] or [10].

Furthermore, the low frequency almost DC component of the voltage on the primary of the transformer TR_2, caused by the presence of the charged particle beam 12, is eliminated at the terminals of the secondary winding of the transformer TR_2 by galvanic isolation of the transformer. This avoids all risk of a breakdown charge on the high impedance input of the operational amplifier U2. Without the presence of the low impedance galvanic isolation of the transformer, the electrical transient of the emission current caused by ignition of the charged particle beam on the probe could cause a breakdown charge on the high impedance input of the output operational amplifier (typically of the order of one TeraOhm for an OPA657 type amplifier made by the Burr Brown company). The input stage of the output operational amplifier U2 is usually fitted with FET transistors provided with an oxide gate of a few tens of nanometers, sensitive to a dielectric breakdown above an applied voltage of a few volts. The breakdown charge is proportional to the thickness of this oxide gate. Further details about the breakdown phenomenon of oxide gates in FET transistors are given for example in documents reference [11] or [12].

Similarly, transformer TR_1 is capable of eliminating the low frequency almost DC component of the voltage created on its secondary, caused by the presence of the charged particle beam 12 on the probe 11. Thus, this signal does not appear at the primary of TR_1 so that the output from amplifier U1 is not disturbed through resistance R3.

Figure 4:
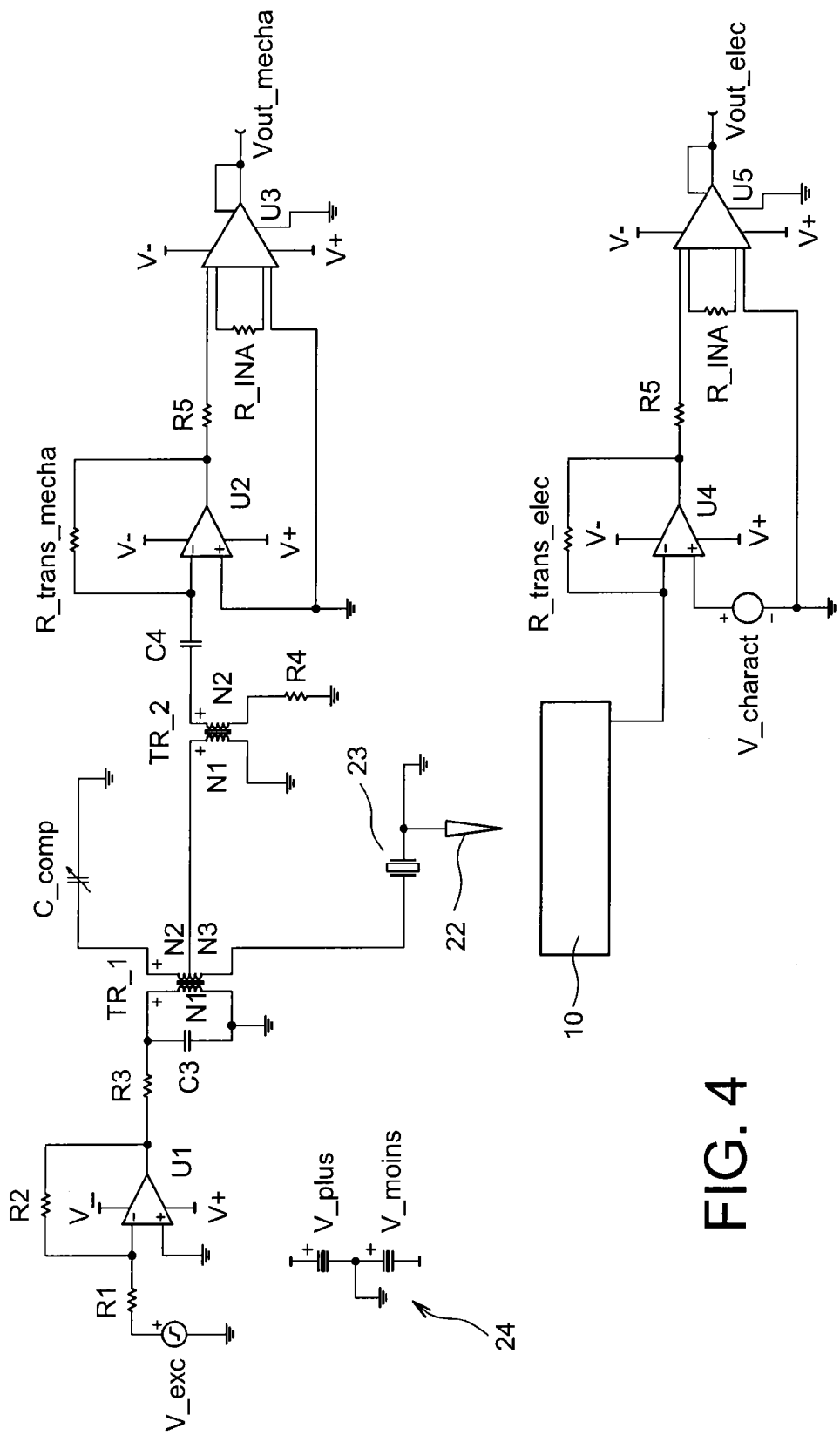
FIG. 4 shows an example of the second embodiment of the device according to the invention shown in FIG. 2.

Concerning the possibility of an electrical breakdown in transformer TR_1 or TR_2, this breakdown will only occur if there is a threshold potential difference between the two windings (primary and secondary of each transformer) separated by electrical insulation. This difference in potential becomes less than the breakdown voltage given in the manufacturer's technical datasheet for said transformer. In this invention, the electrical diagrams in FIGS. 3 and 4 show that the primary and secondary windings of the transformer TR_1 are directly connected to the same electrical ground. Thus, under the low frequency almost DC conditions of use of the charged particle beam 12 on the probe 11, the primary and secondary of TR_1 are connected to the same potential and therefore there will be no electrical breakdown. The primary winding of transformer TR_2 is also directly connected to the ground; its secondary winding being connected to the same ground through the resistance R4. Considering a DC or low frequency condition under which capacitor C4 can be treated like an open circuit, or a high frequency condition in which capacitor C4 can be treated like a closed circuit on the virtual ground provided by the inverting (−) input of the amplifier U2, it can be seen that the secondary winding is also at the same electrical potential as the primary winding of the transformer TR_2. Therefore, the risk of an electrical breakdown for TR_2 is also avoided under these conditions.

However, for precautionary reasons, a certain value is kept for the transformer breakdown threshold to prevent any breakdown during the electrical transient caused by ignition of the electron beam 12 on the probe 11. This requirement is satisfied by using a threshold value of 2 kiloVolts for transformers TR_1 and TR_2 used in a specific implementation of the device according to the invention.

b) Electronic Device for Local Measurement of the Mechanical and Electrical Properties of a Sample This second example embodiment shown in FIG. 4 corresponds to application of the second embodiment shown in FIG. 2.

Apart from the elements already shown in FIG. 3, this example includes:
- a first preamplification stage comprising a third transimpedance operational amplifier U4 and a current-voltage conversion resistance R_trans_elec connected between its inverting (−) input and its output, the input of this third operational amplifier being connected to the sample 10,
- a second amplification stage comprising a second differential instrumentation amplifier U5 with a gain resistance R_INA.

This second example embodiment uses the same structure as the first example embodiment except that the sample, instead of being connected to the ground, is polarised by a voltage V_charact by connecting it to the amplifier U4 and to the current-voltage conversion resistance R_trans_elec. The differential instrumentation amplifier U5 outputs a voltage that can be used by a measurement system on the output side to extract the microtip-sample surface current for a given voltage V_charact, and therefore to obtain local electronic conduction measurements.

Capacitive measurements on microsystems or on a chip may also be envisaged in an SEM electron microscope with the device according to the invention shown in FIG. 4 by using the EFM (Electrostatic Force Microscopy) technique described in document [5].

Specific Implementation of the Device According to the Invention

Figure 5A:
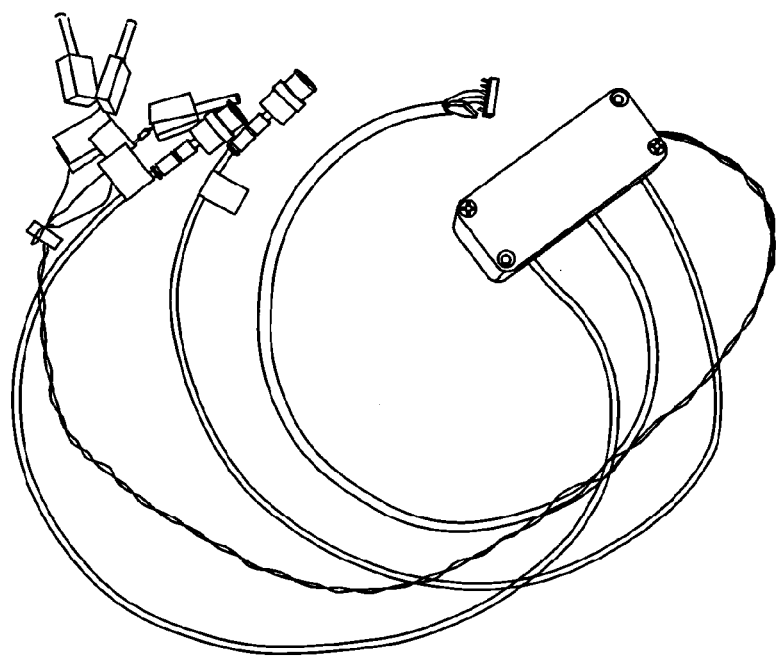
FIGS. 5A and 5B show a global view of an example embodiment of a packaged device according to the invention ready for use, and a detail of such packaging, respectively.
Figure 5B:
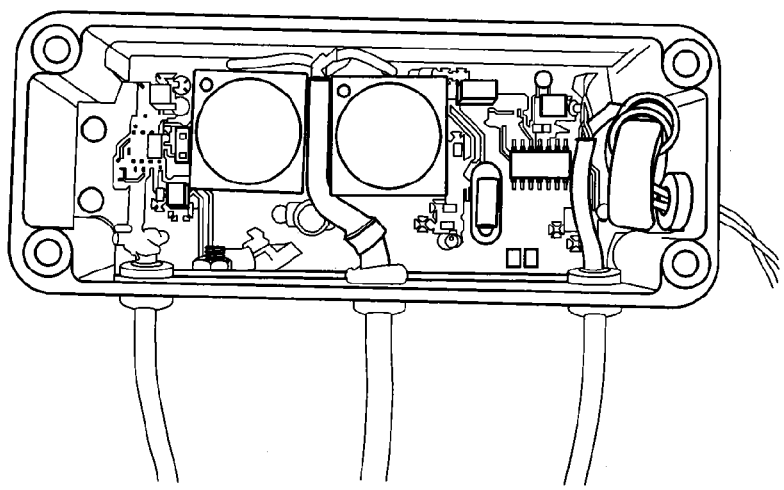

FIG. 5A shows a global view of the first example embodiment of the device according to the invention shown in FIG. 3 packaged and ready for use. FIG. 5B shows details of such packaging. The first and second transformers TR_1 and TR_2 used for galvanic isolation 16 and 17 of the excitation stage 15 and preamplification stage 18 are chosen to be adapted to the frequency band of the piezoelectric resonator. In this embodiment, the first transformer TR_1 is a symmetric point transformer in which the ratio of the number of winding turns is 1:1+1, and for each winding there is an inductance of 3 mH, a DC resistance of 1.3 ohms, an inter-winding capacitance of 30 pF (between the primary and the secondary), a leakage inductance of 8 uH and an E.T. constant of 200 V.us. The ratio of the number of winding turns in the second transformer TR_2 is 1:1, and the electrical characteristics are the same as for transformer TR_1. These characteristics of the two transformers enable a unit gain response of the pass band type in a frequency range between 3 kHz and 1 MHz. The piezoelectric probe 22 used in this case has a resonant frequency of 32 kHz and a quality factor of 10,000.

The electronic device according to this invention has been used successfully to observe a microelectromechanical system (MEMS), for example an extended spiral type nano-spring 25, spirals being obtained by controlled growth of InGaAs/GaAs, as shown in FIGS. 6A to 6E, under an SEM electron microscope and at the same time to analyse the mechanical force of this MEMS system. One end of this spiral 25 may be connected to the apex of the microtip 26 of the piezoelectric probe. The other end may be connected to a PicoProbe microtip 27 connected to a nanotranslator that is capable of extending or compressing the nano-spring in discrete steps of a few tens of nanometers. Furthermore, the first and second transformers TR_1 and TR_2 used for galvanic isolation 16 and 17 of the excitation stage 15 and preamplification stage 18 are chosen to resist an electric shock caused by the charged particle beam 12 directed onto the piezoelectric probe 11. In this case, breakdown voltages (primary-secondary) of 2 kiloVolts for these transformers TR_1 and TR_2 can efficiently isolate the effect of an electron beam with an acceleration energy of 50 keV. The SEM images in FIGS. 6A to 6D were obtained with an electron beam with an acceleration energy of 4 keV.

Figure 6A:
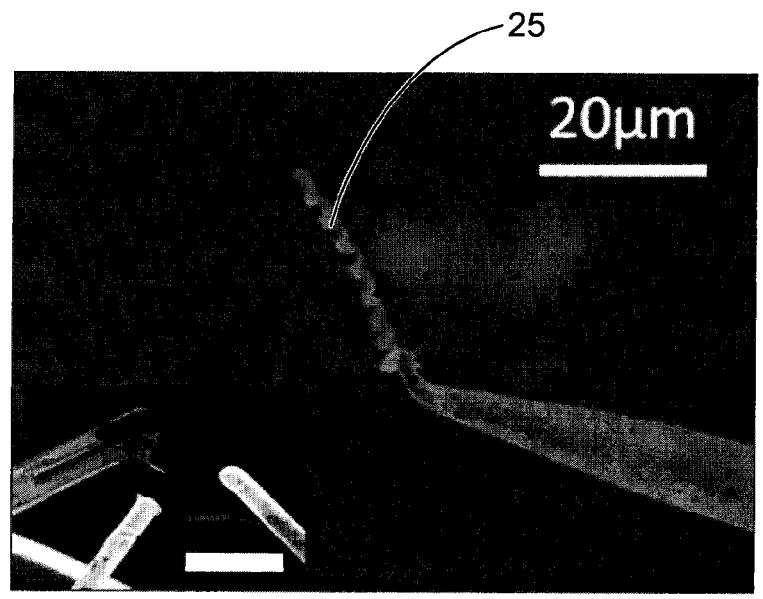
FIGS. 6A to 6E show images illustrating an example application of the device according to the invention.
Figure 6B:
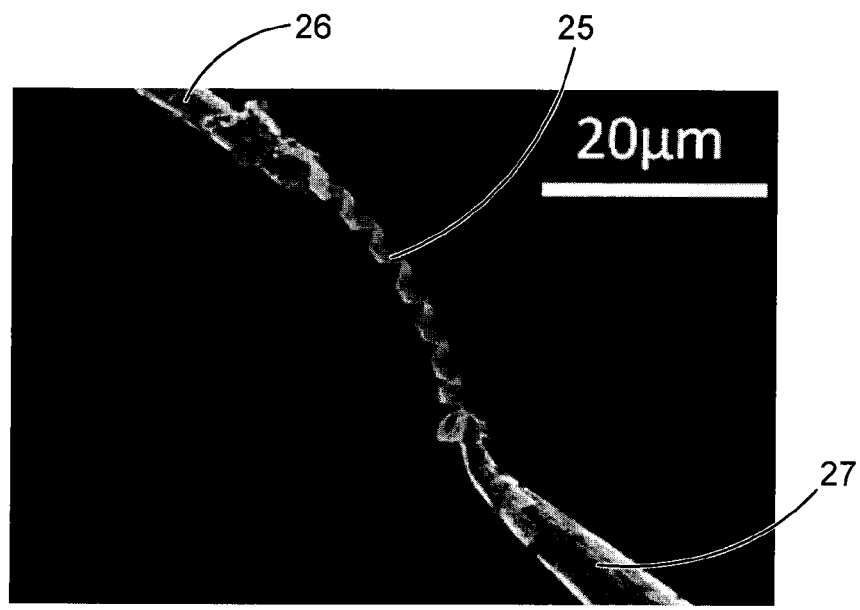

FIGS. 6A and 6B thus represent SEM images of this nano-spring 25 glued at its two ends between the microtip 26 of the piezoelectric probe (in this case a quartz Tuning Fork) and the microtip 27 of the Picoprobe nanotranslator.

Figure 6C:
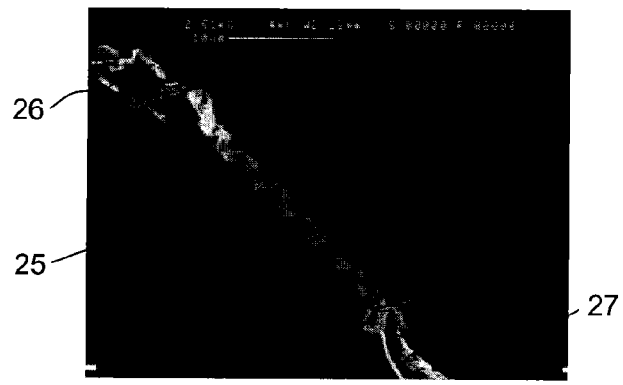
Figure 6D:
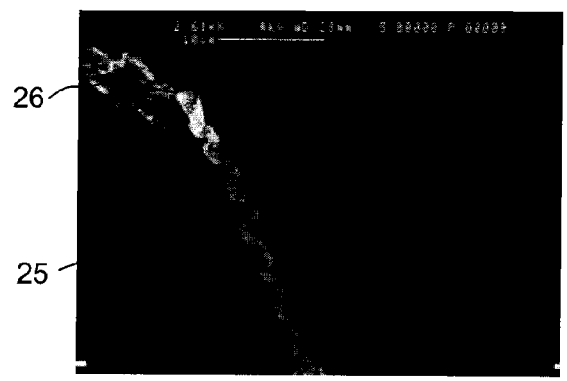

FIGS. 6C and 6D show two SEM images extracted from the film acquired during extension and then compression of the nano-spring 30 to the initial point.

Figure 6E:
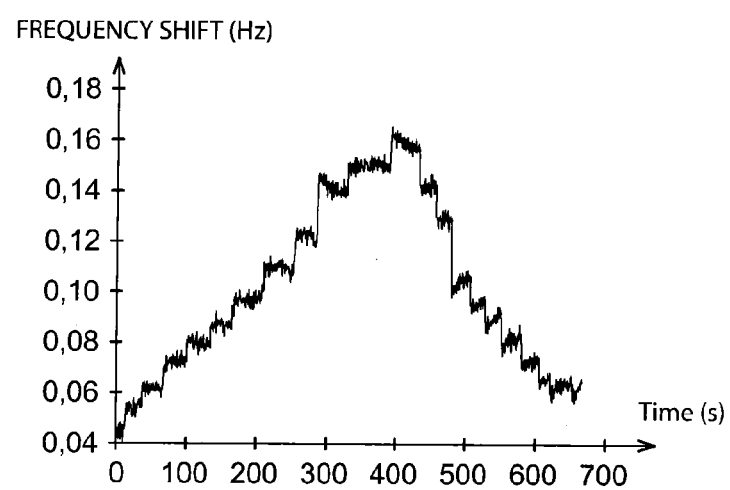

FIG. 6E shows a frequency drift curve of the piezoelectric probe acquired simultaneously due to the electronic device according to this invention. The variation in the resonant frequency drift of the piezoelectric probe can thus be observed when the nano-spring 25 is stretched to a maximum of 1.5 μm and then compressed to its initial position due to the nanotranslator.

The discrete steps of the nanotranslator are clearly visible, with the minimum and maximum in the curve in FIG. 6E corresponding to the extreme positions of the images shown in FIGS. 6C and 6D.

This result demonstrates real time monitoring by SEM imagery of a microelectromechanical system with a combined local measurement of forces involved, by measuring the frequency drift of the piezoelectric resonator. The frequency steps of the curve in FIG. 6E correspond to a force of 3 nanoNewton per step of the nanotranslator.

REFERENCES

[1] <<Advances in atomic force microscopy>> by Franz D. Giessibl (Review of Modern Physics, volume 75, July 2003, pages 949-983)
[2] <<Transparently combining SEM, TEM and FIBS with AFM/SPM and NSOM>> (Nanonics, Issue 2.3 (2002), http://nanonics.co.il/)
[3] US 2004/0216 518
[4] U.S. Pat. No. 6,006,594
[5] <<Electrostatic force microscopy using a quartz tuning fork>> by Yongho Seo, Wonho the and Cheol Seong Hwang (Applied Physics Letters, volume 80, number 23, Jun. 10 2002, pages 4324 to 4326)
[6] Technical Note <<Midcom Transformer Theory>>, by Dave LeVasseur (Technical Note 69, Jun. 1, 1998)
[7] Technical Note by Rhombus Industries Inc. (<<pulse transformers>>)
[8] <<Application Notes—Appendix 6>>, p.24, BH Electronics, www.bhelectronics.com
[9] <<A Guide to Scanning Microscope Observation>> (JEOL)
[10] "Scanning Probe Microscopy and Scanning Electron Microscopy for Electrical Characterization of Semiconductors" by J. C. González, M. I. N. da Silva, K. L. Bunker and P. E. Russell, (Current Issues on Multidisciplinary Microscopy Research and Education, p.274, FORMATEX 2004)
[11] "Dielectric breakdown mechanisms in gate oxides" by S. Lombardo et al. (J. Appl. Phys. 98, 121301, 2005)
[12] "Gate oxide breakdown in FET devices and circuits: From nanoscale physics to system-level reliability" by B. Kaczer et al., (Microelectronics Reliability 47, 559-566, 2007).

The invention claimed is:

1. An electronic control device for a local probe with a piezoelectric resonator and preamplification and processing of its signals, the probe being configured for local measurement of physical properties of a sample in an environment with a particle beam directed towards the probe, wherein:
an excitation voltage generated by excitation means is applied to the piezoelectric resonator through a first galvanic isolation transformer, and wherein a current for measurement of mechanical oscillations of the piezoelectric resonator is applied through a second galvanic isolation transformer to preamplification means on an output side;
the first and second transformers have a sufficiently high primary/secondary breakdown voltage to resist an overvoltage generated by the particle beam;
impedances of the transformer windings are sufficiently low so that electrical current generated in conducting elements by the electrical pulse induced by the particle beam is incapable of damaging a first stage of the preamplification means placed on the output side, and the excitation means placed on an input side.

2. A device according to claim 1, in which the particle beam is an electrically charged particle beam, which is an electron beam.

3. A device according to claim 1, in which the particle beam is an electrically charged particle beam, which is an ion beam.

4. A device according to claim 1, in which the particle beam is composed of electrically neutral particles of atoms or neutrons.

5. A device according to claim 1, in which the primary and secondary windings of the two transformers are connected to a same electrical ground potential.

6. A device according to claim 5, in which the galvanic isolation transformers are such that the first transformer is a symmetric point transformer in which a ratio of number of winding turns is 1:1+1 and the second transformer has a ratio of the number of winding turns 1:1, with same electrical characteristics as the first transformer.

7. A device according to claim 5, in which the two transformers can resist an electric shock caused by a particle beam directed onto the probe.

8. A device according to claim 5, in which the probe includes a microtip with a microsphere made of a magnetized remanent magnetic material at its apex, capable of local measurement of magnetic forces on the sample by MFM.

9. A device according to claim 5, in which the apex of the probe includes a thermocouple or a polymer wire.

10. A device according to claim 5, in which the primary and secondary windings of the first and second transformers have a lower impedance than the input impedance to an output operational amplifier.

11. A device according to claim 10, further comprising means for detecting electrostatic force between the sample and the probe by EFM measurement or by KPFM measurement.

12. A device according to claim 5, in which the probe includes a conducting microtip capable of measuring forces, an end of the microtip including an inorganic or organic coating.

13. A device according to claim 12, in which the sample is polarized relative to the microtip connected to ground, the sample being electrically connected to a current/voltage converter to measure physical properties between the microtip and the sample.

* * * * *